United States Patent
Hsu et al.

(10) Patent No.: US 9,153,933 B2
(45) Date of Patent: Oct. 6, 2015

(54) TI: SAPPHIRE CRYSTAL FIBER, MANUFACTURING METHOD THEREOF, AND WIDE BAND LIGHT SOURCE USING THE SAME

(71) Applicant: NATIONAL TAIWAN UNIVERSITY, Taipei (TW)

(72) Inventors: Kuang-Yu Hsu, Taipei (TW); Dong-Yo Jheng, Taipei (TW); Yi-Han Liao, Taipei (TW); Sheng-Lung Huang, Taipei (TW)

(73) Assignee: National Taiwan University, Taipei (TW)

( * ) Notice: Subject to any disclaimer, the term of this patent is extended or adjusted under 35 U.S.C. 154(b) by 68 days.

(21) Appl. No.: 14/073,197

(22) Filed: Nov. 6, 2013

(65) Prior Publication Data

US 2014/0072010 A1 Mar. 13, 2014

Related U.S. Application Data

(62) Division of application No. 12/967,853, filed on Dec. 14, 2010, now Pat. No. 8,625,948.

(51) Int. Cl.
| | |
|---|---|
| *H01S 3/16* | (2006.01) |
| *H01S 3/067* | (2006.01) |
| *G02B 6/02* | (2006.01) |
| *C30B 29/20* | (2006.01) |
| *C30B 13/00* | (2006.01) |
| *C30B 13/10* | (2006.01) |
| *C30B 13/24* | (2006.01) |
| *C30B 13/30* | (2006.01) |
| *H01S 3/06* | (2006.01) |
| *H01S 3/094* | (2006.01) |
| *C30B 15/16* | (2006.01) |
| *C30B 13/16* | (2006.01) |

(52) U.S. Cl.
CPC ............ *H01S 3/1636* (2013.01); *C30B 29/20* (2013.01); *G02B 6/02* (2013.01); *H01S 3/06716* (2013.01); *C30B 13/005* (2013.01); *C30B 13/10* (2013.01); *C30B 13/16* (2013.01); *C30B 13/24* (2013.01); *C30B 13/30* (2013.01); *C30B 15/16* (2013.01); *H01S 3/061* (2013.01); *H01S 3/094038* (2013.01); *H01S 3/1625* (2013.01)

(58) Field of Classification Search
CPC .................... H01S 3/06716; H01S 3/1636
See application file for complete search history.

(56) References Cited

U.S. PATENT DOCUMENTS

| | | | |
|---|---|---|---|
| 6,389,198 B2 | 5/2002 | Kafka et al. | |
| 7,373,061 B2 | 5/2008 | Hongo | |
| 7,688,871 B2 | 3/2010 | Kiriyama et al. | |
| 2005/0121629 A1* | 6/2005 | Unterrainer et al. | 250/504 R |
| 2008/0008438 A1 | 1/2008 | Fukuda et al. | |

OTHER PUBLICATIONS

Lushen Wu, Growth and Laser Properties of Ti: Sapphire Single Crystal Fibres; Electronics Letters, Jul. 6, 1995, vol. 31, No. 14, p. 1151-1152.

* cited by examiner

*Primary Examiner* — Jerry Rahll
(74) *Attorney, Agent, or Firm* — Rosenberg, Klein & Lee

(57) ABSTRACT

The present invention relates to a crystal fiber, and more particularly to a Ti: sapphire crystal fiber, a manufacturing method thereof, and a wide band light source with the same. The Ti: sapphire single crystal is grown by means of laser-heated pedestal growth (LHPG) method into a crystal fiber of a predetermined diameter. The as-grown crystal fiber is annealed for enhancing its fluorescence and reducing the infra-red residual absorption. The annealed crystal fiber is inserted into a glass capillary and is grown into a single-clad crystal fiber. The wide band light source comprises: a pumping source for providing a pumping light; a single-clad Ti: sapphire crystal fiber for absorbing the pumping light and emitting the wide band light.

13 Claims, 7 Drawing Sheets

TI: SAPPHIRE CRYSTAL FIBER, MANUFACTURING METHOD THEREOF, AND WIDE BAND LIGHT SOURCE USING THE SAME

REFERENCE TO RELATED APPLICATION

This Application is being filed as a Divisional Application based on Ser. No. 12/967,853, filed 14 Dec. 2010, currently pending.

FIELD OF THE INVENTION

The present invention is related to a Ti: sapphire (titanium-doped sapphire) crystal fiber, manufacturing method thereof, and wide band light source using the same.

BACKGROUND

In the current application of Ti: sapphire (Ti: $Al_2O_3$) available on the market, a bulk crystal is mainly used as gain medium for a Ti: sapphire laser. There is a significant limit on practical application due to a bulky laser device, resulted from a need for a high wattage pumping source.

Some academic groups have invested the research and development of the structure of Ti: sapphire integrated optical waveguide, which is fabricated mainly by growing a Ti: sapphire crystal layer on a substrate, and then etching the grown Ti: sapphire crystal. The manufacturing process is difficult and complicated, as well as the finished waveguide still far from commercialization due to its considerably high transmission loss.

SUMMARY OF THE INVENTION

It is one object of the present invention to provide a crystal fiber, particularly to a Ti: sapphire crystal fiber, manufacturing method thereof, and wide band light source using the same.

It is another object of the present invention to provide a Ti: sapphire crystal fiber comprising a Ti: sapphire crystal single crystal core and a glass cladding, constituting an optical waveguide structure having lower transmission loss compared with a single crystal fiber without cladding.

It is a further object of the present invention to provide a Ti: sapphire crystal fiber having a core with a diameter of less than 50 µm, allowed for enhancing luminous efficiency of a wide band light source.

It is a further object of the present invention to provide a manufacturing method of a Ti: sapphire crystal fiber capable of growing a Ti: sapphire single crystal rod into a crystal fiber having a predetermined diameter through a simple manufacturing process by means of LHPG method substantially.

It is a further object of the present invention to provide a manufacturing method of a Ti: sapphire crystal fiber capable of manufacturing a Ti: sapphire crystal fiber with high quality and small diameter through multiple crystal growths by means of LHPG method.

It is a further object of the present invention to provide a manufacturing method of a Ti: sapphire crystal fiber, in which the Ti: sapphire crystal fiber is annealed by laser or furnace heating so as to enhance output power.

It is a further object of the present invention to provide a manufacturing method of a Ti: sapphire crystal fiber, in which a single-clad Ti: sapphire crystal fiber is manufactured by LHPG method, so as to lower transmission loss and enhance output power.

It is a further object of the present invention to provide a wide band light source device using a Ti: sapphire crystal fiber, in which a single-clad Ti: sapphire crystal fiber is mainly used for fabricating a wide band light source.

It is a further object of the present invention to provide a wide band light source device using a Ti: sapphire crystal fiber, in which a single-clad Ti: sapphire crystal fiber is used to greatly reduce the volume of the device, enhance luminous efficiency, reduce requirement for light collimation, and increase system stability.

It is a further object of the present invention to provide a wide band light source device using a Ti: sapphire crystal fiber, in which a pumping light source is selected from a frequency-doubled solid-state laser having a wavelength of 532 nm or a blue semiconductor diode laser.

To achieve the above objects, the present invention to provide a wide band light source device using a Ti: sapphire crystal fiber, comprising: a core made of Ti: sapphire single crystal; and a cladding covering the outside of said core.

The present invention further provides a manufacturing method of a Ti: sapphire crystal fiber, comprising: providing a Ti: sapphire single crystal rod; growing said single crystal rod into a crystal fiber having a predetermined diameter by means of LHPG method; annealing said crystal fiber; providing a glass capillary into which said crystal fiber is placed; and growing said crystal fiber covered inside said glass capillary into a single cladding Ti: sapphire crystal fiber by means of LHPG method.

The present invention further provides a wide band light source device using a Ti: sapphire crystal fiber, comprising: a single cladding Ti: sapphire crystal fiber; and a pumping light source used for providing a pumping beam onto one end of said crystal fiber.

DETAILED DESCRIPTION

Figure 1:
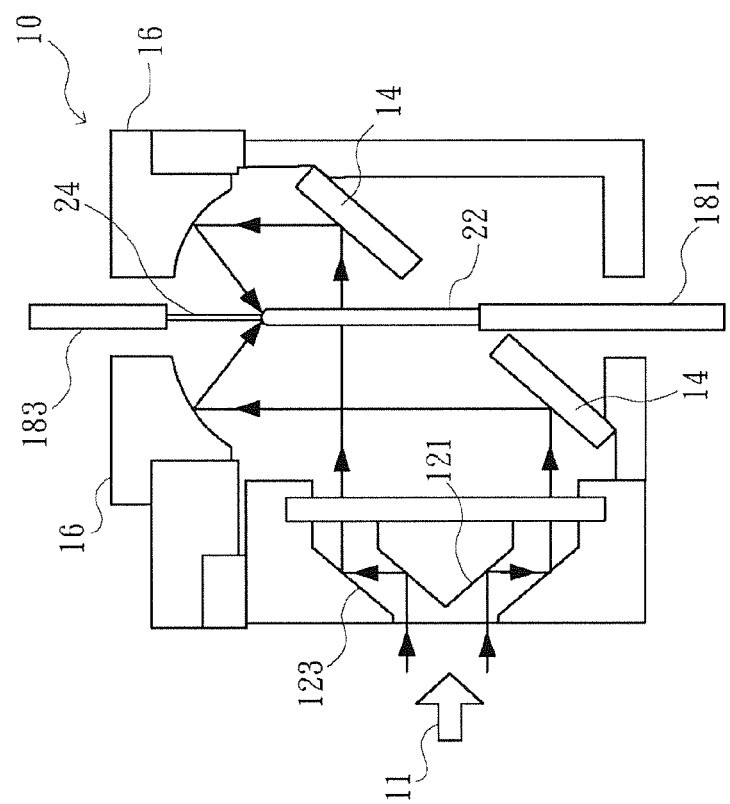
FIG. 1 is a diagram showing the manufacturing by means of LHPG method according to one embodiment of the present invention.
Figure 2:
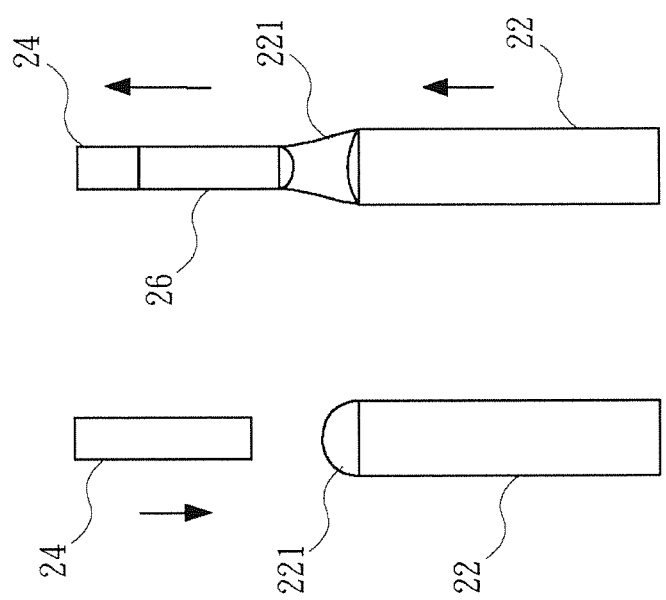
FIG. 2 is a diagram showing the growth of crystal fiber according to one embodiment of the present invention.

Referring to FIGS. 1 and 2, there are shown diagrams illustrating the manufacturing using Laser-Heated Pedestal Growth (LHPG) method and the growth of crystal fiber, respectively, according to one preferred embodiment of the present invention. As illustrated in these figures, the Ti-sapphire (Ti: $Al_2O_3$) crystal fiber is fabricated mainly by LHPG method. Substantially, in a laser-heated device 10, a first fixture 181 is used to clamp a Ti: sapphire source rod 22, and a second fixture 183 is used to clamp a seed crystal 24.

After a laser beam 11 generated by $CO_2$ laser is directed into the laser-heated device 10, the collimated light beam may be converted into a ring light beam via a first conic mirror 121 and a second conic mirror 123. Subsequently, the ring light beam may be in turn reflected onto a parabolic mirror 16 via a reflective mirror 14, and then focused on the end face of the Ti: sapphire single crystal rod 22.

The end face of the Ti: sapphire single crystal rod 22 may be melted to form a molten zone 221 because it is heated by laser beam. At this moment, the seed crystal 24 is allowed to contact with the molten zone 221 and then pulled up slowly, while the Ti: sapphire source rod 22 is pushed up more slowly. Thus, a crystal fiber 26 with the same crystal orientation as that of seed crystal 24 may be grown. Various ratios of diameter reduction may be achieved by the use of various speed ratios between the growing speed of seed crystal 24 and the speed of pushing source rod 22. For instance, if the speed ratio between the growing speed of seed crystal 24 and the speed of pushing source rod 22 is 16:1, the diameter ratio between the grown crystal fiber 26 and the single crystal rod 22 is then 1:4.

A general single crystal rod cut from a Ti: sapphire single crystal block is a square bar of approximate 500 μm×500 μm. The LHPG method may be performed two, three, or more times for growing, so as to obtain a crystal fiber of better quality and thinner diameter. For instance, the single crystal rectangular rod is previously grown into a crystal fiber having a diameter in the range between 250 μm and 320 μm, followed by a subsequent growth which results in a reduced diameter in the range between 80 μm and 180 μm, and in turn a further growth which results in a reduced diameter of less than 50 μm.

Figure 3:
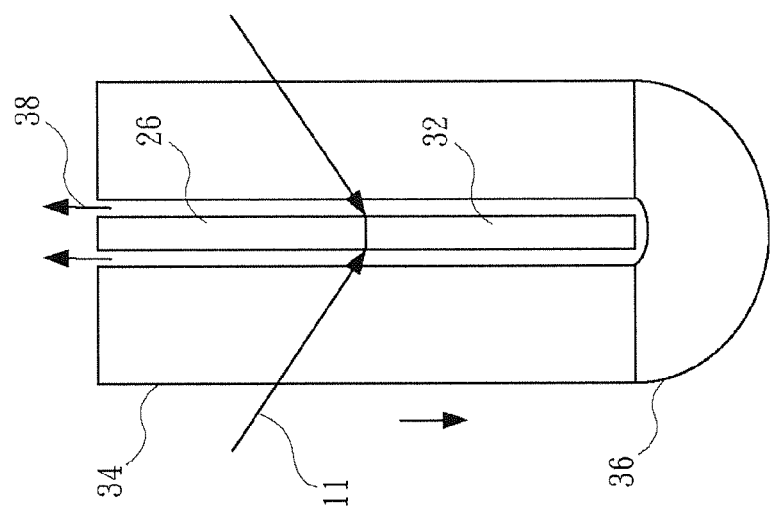
FIG. 3 is a diagram showing the annealing according to one embodiment of the present invention.

Referring to FIG. 3, there is shown a diagram illustrating annealing according to one embodiment of the present invention. In the Ti: sapphire crystal fiber, fluorescence is generated when $Ti^{3+}$ is pumped. During the process of growth with diameter reduction using the LHPG method, however, a part of $Ti^{3+}$ may be oxidized into $Ti^{4+}$ without fluorescence generated. Moreover, ions of $Ti^{3+}$ and $Ti^{4+}$ may be paired, leading to the absorption of a wide band centered at the wavelength of 800 nm, which is just coincided with fluorescent wave band, thus seriously affecting optical efficiency. Therefore, an annealing process for converting $Ti^{4+}$ ions into $Ti^{3+}$ ions is necessary after the Ti: sapphire crystal fiber is grown with diameter reduction to be one having a predetermined diameter.

In this connection, this annealing process may be performed in a furnace. Namely, the Ti: sapphire crystal fiber is placed into the furnace with a reducing atmosphere like hydrogen and inert gas, and then annealed at high temperature in the range between 1500° C. and 2000° C.

Also, the annealing process of the present invention may be performed by laser heating. As shown in FIG. 3, a capillary 34 with high softening point may be firstly placed into the Ti: sapphire crystal fiber 26. Either a fused silica capillary with high softening point of 1600° C., or a quartz capillary with higher softening point may be used. The capillary 34 with high softening point containing the Ti: sapphire crystal fiber 26 therein may be placed into the laser-heated device, with one end of the capillary 34 with high softening point being melted by laser heating to form a sealing 36, and the other end thereof being either vacuumed as indicated by an arrow 38, or refilled with hydrogen and inert gas. The laser beam 11 is enabled to focus onto the Ti: sapphire crystal fiber 26, so as to heat this Ti: sapphire crystal fiber 26 until the maximum temperature that the capillary with high softening point can withstand is reached.

A slow motion of the Ti: sapphire crystal fiber 26 together with the capillary 34 with high softening point is allowed so as to anneal each part of the Ti: sapphire crystal fiber 26. The circumstance for this annealing may be filled with the vacuum or a controlled reducing atmosphere. Moreover, an annealed Ti: sapphire crystal fiber 32 is provided with more $Ti^{3+}$ by which strong wide band fluorescence may be generated.

Figure 4:
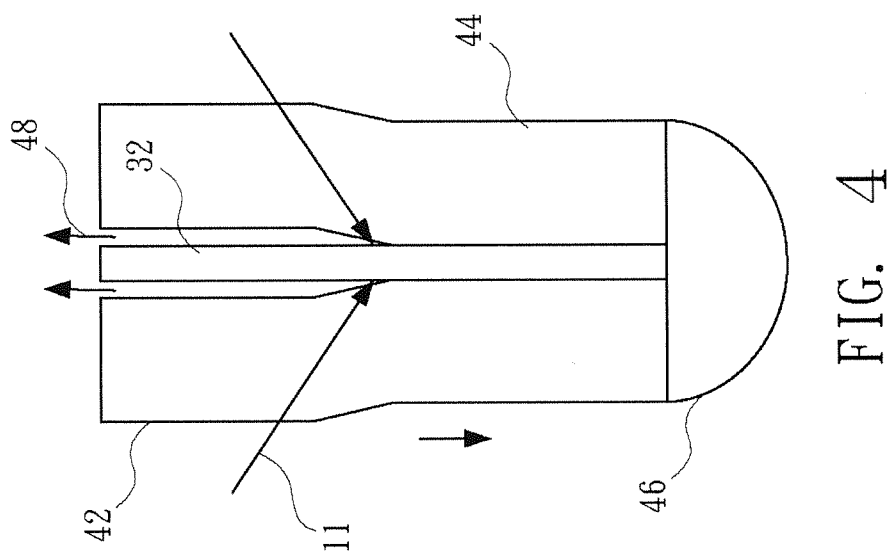
FIG. 4 is a diagram showing the manufacturing of a single-clad crystal fiber of the present invention.

Referring to FIG. 4, there is shown a diagram illustrating the manufacturing of a single-clad fiber of the present invention. The annealed Ti: sapphire crystal fiber 32 is placed into a glass capillary. This glass capillary may be selectively a borosilicate capillary 42 or made from other types of optical glass with softening point lower than 1000.The borosilicate capillary 42 containing the annealed Ti: sapphire crystal fiber 32 may be placed into the laser-heated device, with one end of the borosilicate capillary 42 being heated by laser to form a sealing 46, and the other end thereof being vacuumed as indicated by an arrow 48. The laser beam 11 is enabled to focus onto the annealed Ti: sapphire crystal fiber 32 for heating it until a temperature higher than the softening temperature of the borosilicate capillary 42 is reached.

The softened borosilicate capillary 42 may be attached onto the annealed Ti: sapphire crystal fiber 32 owing to the pressure difference between its inner vacuum and outer pressure, in such a way a cladding layer 44 may be formed. A slow motion of the annealed Ti: sapphire crystal fiber 32 together with the borosilicate capillary 42 may be enabled, so as to heat each part of the annealed Ti: sapphire crystal fiber 32 to be covered by the cladding layer.

The refractive index of the core in the Ti: sapphire crystal fiber of the single cladding structure is greater than that of the cladding 44. Thus, an optical waveguide structure may be formed.

Figure 5:
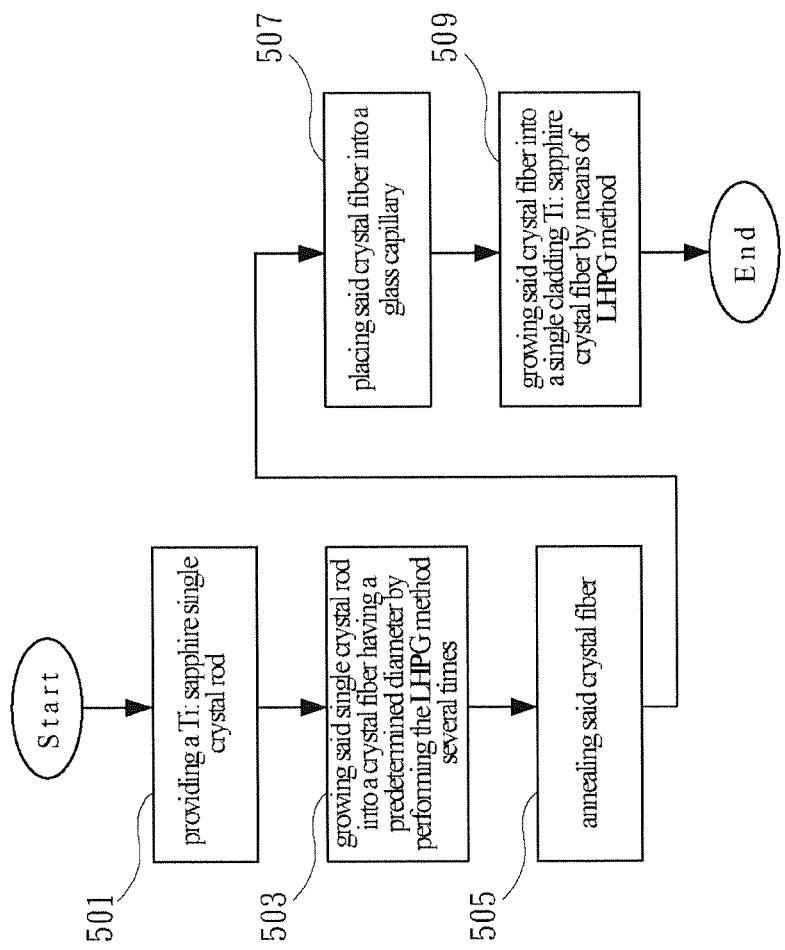
FIG. 5 is a flow chart illustrating the manufacturing method of a single-clad crystal fiber of the present invention.

Referring to FIG. 5, there is shown a flow chart illustrating a manufacturing method of a single-clad crystal fiber of the present invention. As illustrated in this figure, the manufacturing method of the present invention comprises the steps follows. In step 501, firstly, a Ti: sapphire single crystal rod is provided. The single crystal rod is grown with diameter reduction several times by means of LHPG method, in such a way that a Ti: sapphire crystal fiber having a predetermined diameter, such as 10 μm to 50 μm, for example, may be grown, as shown in step 503.

The annealing process for the Ti: sapphire crystal fiber having a predetermined diameter may be performed selectively by the furnace, and also by laser heating, as shown in step 505. Subsequently, in step 507, the annealed Ti: sapphire crystal fiber is placed into a glass capillary having an appropriate bore (for instance, 50 to 100 μm for the inner diameter, and 80 to 170 μm for the outer diameter).

Finally, in step 509, the Ti: sapphire crystal fiber covered inside the glass capillary is grown into a single-clad Ti: sapphire crystal fiber by means of LHPG method. In this connection, a capillary of optical glass material having a softening temperature lower than 1000° C. , such as borosilicate capillary, for example, may be selected as this glass capillary.

Figure 6:
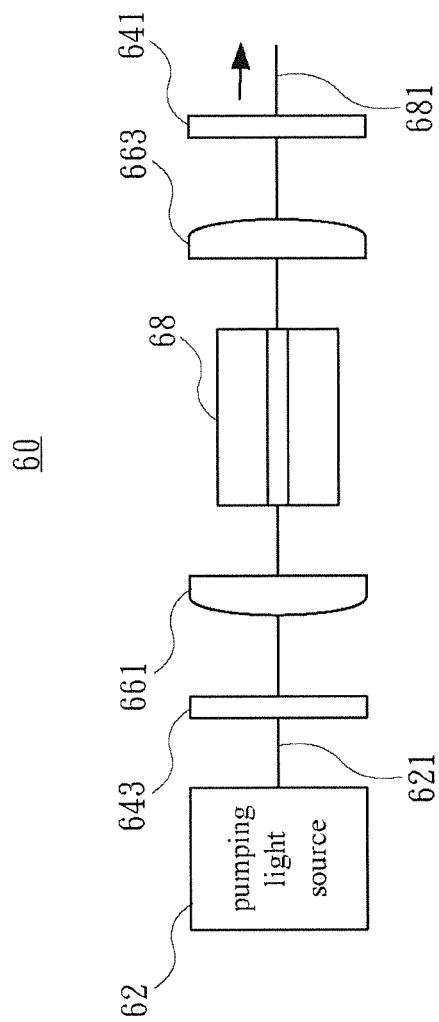
FIG. 6 is a diagram showing a wide band light source according to one embodiment of the present invention.

Referring to FIG. 6, there is shown a diagram illustrating a wide band light source device according to one embodiment of the present invention. As illustrated in this figure, a wide band light source device 60 of the present invention comprises a single-clad Ti: sapphire crystal fiber 68 and a pumping light source 62.

In this case, the pumping light source 62 is used for providing a pumping beam 621. Preferably, the pumping light source 62 is a frequency-doubled laser having a wavelength of 532 nm, or a blue laser diode having a wavelength of 446 nm. It is preferable that a diameter of a core in the single-clad Ti: sapphire crystal fiber 68 is smaller than 50 μm, as mentioned above.

The wide band light source device 60 further comprises a focusing unit 661, provided between the pumping light source 62 and the single-clad Ti: sapphire crystal fiber 68, used for focusing the pumping beam 621 onto the core of the single-clad Ti: sapphire crystal fiber 68. $Ti^{3+}$ of the core is capable of absorbing the pumping light and then emitting wide band fluorescence, which may be amplified as propagating along the optical waveguide structure of the single-clad Ti: sapphire crystal fiber 68, and finally radiated from the other end of the crystal fiber 68 as a wide band beam 681.

The wide band light source device 60 further comprises a first filter 641 provided at the other end of the crystal fiber 68. The wide band beam 681 may be utilized on condition that the remaining pumping light is filtered by the first filter 641.

Moreover, between the pumping light source 62 and the crystal fiber 68, there is further provided with a second filter 643, used for filtering unnecessary residual light at 808 nm and 1064 nm of the output of the frequency-doubled laser at 532 nm. Between the single cladding Ti: sapphire crystal fiber 68 and the first filter 641, there is also additionally provided with a collimation unit 663, used for collimating the wide band beam 681, facilitating the use of the wide band beam 681 at the backend.

Figure 7:
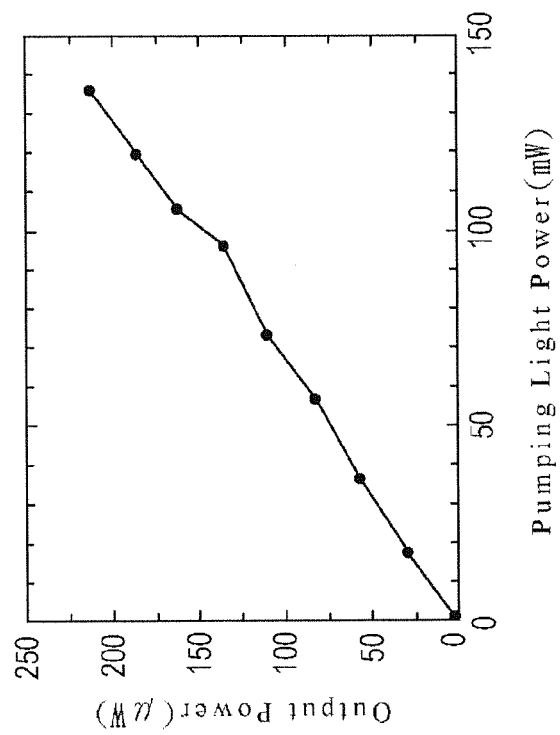
FIG. 7 is an output power diagram of the single-clad crystal fiber of the present invention.

Referring to FIG. 7, there is shown an output power diagram of a single-clad Ti: sapphire crystal fiber of the present invention. In the operation of the single-clad Ti: sapphire crystal fiber of the present invention, as illustrated in this figure, the output power of 213 μW may be obtained for the wide band beam when the absorbed pump power is 136 mW. In this case, the power conversion efficiency is approximately $1.5 \times 10^{-3}$.

Figure 8:
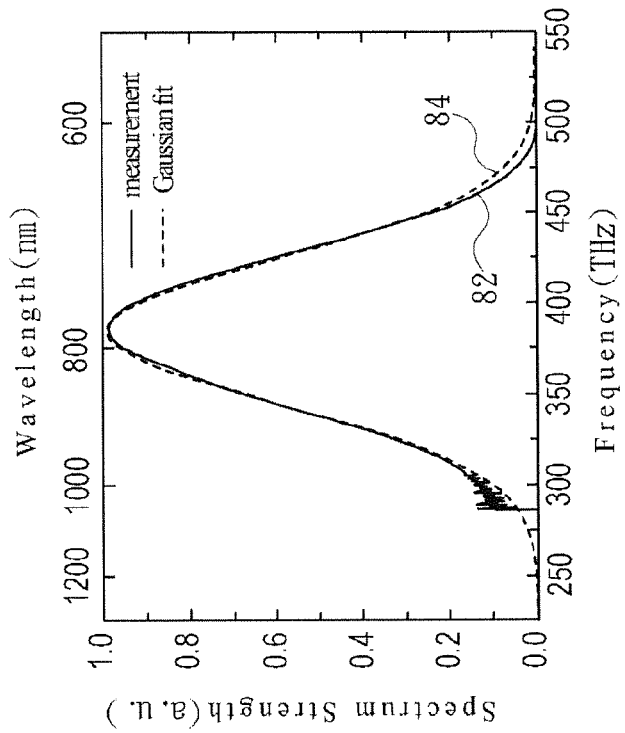
FIG. 8 is an output spectrum of the single-clad crystal fiber of the present invention.

Referring to FIG. 8, there is shown a spectrum of the output of the single-clad Ti: sapphire crystal fiber of the present invention. For the single-clad Ti: sapphire crystal fiber of the present invention, there is generated fluorescence with a center wavelength of 759 nm, bandwidth (full width at half maximum or 3-dB bandwidth) of 181 nm, optical spectrum coverage over the wave band between 670 and 850 nm, and coherence length in air of 1.45 μm, as illustrated in this figure. The optical spectrum is substantially distributed near infrared regime, just as the part being least absorbed by body tissues. Thus, it is suitable for the application for optical coherence tomography (OCT). Additionally, in optical tomography, the longitudinal resolution up to 1.45 μm is achieved, while the spectral density distribution of measurement 82 of optical spectrum shown in FIG. 8 is extremely close to the distribution of Gaussian fit 84. This perfect Gaussian waveform may lead to extremely small side lobes of interference signal and an extremely little cross-talk of longitudinal image pixels when this wide band light source is applied for optical tomography. Thereby, a three-dimensional image with high picture quality may be realized. Indeed, an excellent wide band light source is obtained.

The foregoing description is merely one embodiment of the present invention and not considered as restrictive. All equivalent variations and modifications in shape, structure, feature, and spirit in accordance with the appended claims may be made without in any way from the scope of the invention.

The invention claimed is:

1. A wide band light source device using a Ti: sapphire crystal fiber, comprising:
    a single-clad Ti: sapphire crystal fiber; and
    a pumping light source used for providing a pumping beam onto one end of said crystal fiber;
    wherein the full-width at half-maximum of output optical spectrum covers a wave band between 670 and 850 nm with coherence length in air of 1.45 μm.

2. The wide band light source device according to claim 1, wherein a core of said single-clad Ti: sapphire crystal fiber has a diameter of less than 50 μm.

3. The wide band light source device according to claim 1, wherein said pumping light source is selected from a frequency-doubled laser or a blue diode laser.

4. The wide band light source device according to claim 1, further comprising a focusing unit, provided between said pumping light source and said crystal fiber, used for focusing said pumping beam onto said crystal fiber.

5. The wide band light source device according to claim 1, further comprising a first filter, provided at the other end of said crystal fiber, used for filtering remaining pumping light.

6. The wide band light source device according to claim 1, further comprising a collimation unit, provided at the other end of said crystal fiber, used for collimating said wide band beam.

7. The wide band light source device according to claim 1, further comprising a second filter, provided between said pumping light source and said crystal fiber, used for filtering the pumping light having wavelengths other than that necessary for pumping.

8. A wide band light source device using a Ti: sapphire crystal fiber, comprising:
    a single-clad Ti: sapphire crystal fiber;
    a pumping light source used for providing a pumping beam onto one end of said crystal fiber; and
    a first filter, provided at the other end of said crystal fiber, used for filtering remaining pumping light.

9. The wide band light source device according to claim 8, wherein a core of said single-clad Ti: sapphire crystal fiber has a diameter of less than 50 μm.

10. The wide band light source device according to claim 8, wherein said pumping light source is selected from a frequency-doubled laser or a blue diode laser.

11. The wide band light source device according to claim 8, further comprising a focusing unit, provided between said pumping light source and said crystal fiber, used for focusing said pumping beam onto said crystal fiber.

12. The wide band light source device according to claim 8, further comprising a collimation unit, provided at the other end of said crystal fiber, used for collimating said wide band beam.

13. The wide band light source device according to claim 8, further comprising a second filter, provided between said pumping light source and said crystal fiber, used for filtering the pumping light having wavelengths other than that necessary for pumping.

* * * * *